US009117660B2

(12) United States Patent
Murakami et al.

(10) Patent No.: US 9,117,660 B2
(45) Date of Patent: Aug. 25, 2015

(54) APPARATUS, METHOD AND PROGRAM FOR MANUFACTURING NITRIDE FILM

(75) Inventors: Shoichi Murakami, Amagasaki (JP); Masayasu Hatashita, Amagasaki (JP)

(73) Assignee: SPP Technologies Co., Ltd., Tokyo (JP)

( * ) Notice: Subject to any disclaimer, the term of this patent is extended or adjusted under 35 U.S.C. 154(b) by 0 days.

(21) Appl. No.: 14/238,289

(22) PCT Filed: May 22, 2012

(86) PCT No.: PCT/JP2012/063026
§ 371 (c)(1),
(2), (4) Date: Feb. 11, 2014

(87) PCT Pub. No.: WO2013/021705
PCT Pub. Date: Feb. 14, 2013

(65) Prior Publication Data
US 2014/0220711 A1    Aug. 7, 2014

(30) Foreign Application Priority Data

Aug. 11, 2011  (JP) .................................. 2011-175566

(51) Int. Cl.
*H01L 21/02* (2006.01)
*C23C 16/34* (2006.01)
*C23C 16/509* (2006.01)
*H01L 21/66* (2006.01)

(52) U.S. Cl.
CPC .......... *H01L 21/0217* (2013.01); *C23C 16/345* (2013.01); *C23C 16/509* (2013.01); *H01L 21/0214* (2013.01); *H01L 21/02274* (2013.01); *H01L 22/12* (2013.01)

(58) Field of Classification Search
CPC .............. G02B 6/132; H01L 21/02274; H01L 21/0234; H01L 21/0214; H01L 21/31604; H01L 22/12
See application file for complete search history.

(56) References Cited

U.S. PATENT DOCUMENTS

| 5,464,499 | A | * | 11/1995 | Moslehi et al. ................ 438/729 |
| 5,879,574 | A | * | 3/1999 | Sivaramakrishnan et al. .. 216/60 |
| 6,103,601 | A | * | 8/2000 | Lee et al. ........................ 438/513 |
| 6,844,612 | B1 | * | 1/2005 | Tian et al. ...................... 257/634 |
| 6,857,387 | B1 | * | 2/2005 | Sun et al. ................... 118/723 E |

(Continued)

FOREIGN PATENT DOCUMENTS

| JP | H02-162788 A | 6/1990 |
| JP | H03-151637 A | 6/1991 |

(Continued)

*Primary Examiner* — Evan Pert
*Assistant Examiner* — Gustavo Ramallo
(74) *Attorney, Agent, or Firm* — Marvin A. Motsenbocker; Mots Law, PLLC

(57) ABSTRACT

A nitride film manufacturing apparatus forms a nitride film on a substrate provided in a chamber by a plasma CVD technique. Specifically, the nitride film manufacturing apparatus includes a controller for calculating a first period for applying first high-frequency power having a relatively high frequency and a second period for applying second high-frequency power having a relatively low frequency in order to obtain desired compressive stress or tensile stress of the nitride film, based on distribution of a refractive index of the nitride film and/or distribution of a deposition rate of the nitride film, the distribution falling within a predetermined numerical range and being obtained using the first high-frequency power and/or the second high-frequency power applied independently for forming the nitride film.

11 Claims, 9 Drawing Sheets

(56) References Cited

U.S. PATENT DOCUMENTS

| | | |
|---|---|---|
| 7,109,098 B1 * | 9/2006 | Ramaswamy et al. ........ 438/513 |
| 8,124,522 B1 * | 2/2012 | Wu et al. ........................ 438/618 |
| 2002/0033330 A1 * | 3/2002 | Demaray et al. ......... 204/192.26 |
| 2003/0175142 A1 * | 9/2003 | Milonopoulou et al. ....... 419/49 |
| 2005/0103264 A1 * | 5/2005 | Jansen ........................... 118/715 |
| 2006/0084236 A1 * | 4/2006 | Vogt ............................... 438/381 |
| 2006/0260545 A1 * | 11/2006 | Ramaswamy et al. ........ 118/719 |

FOREIGN PATENT DOCUMENTS

| | | |
|---|---|---|
| JP | 2002-270879 A | 9/2002 |
| JP | 2002-367986 A | 12/2002 |

\* cited by examiner

US 9,117,660 B2

APPARATUS, METHOD AND PROGRAM FOR MANUFACTURING NITRIDE FILM

TECHNICAL FIELD

The present invention relates to an apparatus, a method, and a program for manufacturing a nitride film.

BACKGROUND ART

Various semiconductor devices are still being developed and utilized intensively, and there is no doubt that it will continuously be in the important positions. Elemental techniques essential for the development of the semiconductor devices include forming so-called thin films such as oxide films, nitride films, and oxynitride films. While the semiconductor structure is being miniaturized rapidly, this elemental technique can never be developed without improvement in film quality and achievement of film forming of high controllability.

There have been disclosed many film forming techniques. Such already disclosed techniques include a technique for reducing or preventing charge-up damage to a formed insulating film, by simultaneously applying power having two different frequencies in a parallel-plate plasma CVD apparatus (Patent Document 1).

PRIOR ART DOCUMENT

Patent Document

Patent Document 1: JP 2002-367986 A

SUMMARY OF THE INVENTION

Problems to be Solved by the Invention

As mentioned above, in order to develop the various semiconductor devices, improvement in film quality and controllability is truly desired in the technique for thin film forming.

While the semiconductor structure is being miniaturized year by year, in addition to improvement in film quality, reliability and the like including durability of its device will be largely affected unless appropriately controlling stress of various types (to be generally referred to in the present application), which can be generated due to film forming. In particular, oxynitride films and nitride films (hereinafter, generally referred to as "nitride films" in the present application) are widely utilized because of usefulness in terms of film quality. Meanwhile, there is a problem that control of stress generated by film forming is quite difficult.

For example, a nitride film formed by simultaneously applying the power of the two different frequencies using the parallel-plate plasma CVD apparatus disclosed in the prior art still has the problem of low controllability of the stress of the nitride film, even if the problem of charge-up damage is solved.

The inventors of the present application had recognized that a nitride film formed by the plasma CVD technique is likely to have tensile stress or compressive stress, in order to achieve a desired refractive index or uniformity of a deposition rate in the nitride film. The problem of failing to obtain the desired refractive index is typically caused by changing the film forming conditions (such as temperature of a substrate on which a nitride film is formed or internal pressure of a chamber in which the substrate is provided) in order to eliminate such stress. In other words, if the various processing conditions are optimized just in order to obtain the desired stress, the refractive index or uniformity of the deposition rate in the formed nitride film tends to be out of a desired numerical range. The inventors of the present application had to go through many trials and errors in order to achieve all of the physical property values and the processing properties mentioned above.

Solutions to the Problems

The present invention provides a technique by which a physical property (a refractive index) and/or a processing property (uniformity of distribution of a deposition rate) of a nitride film falls within a predetermined numerical range and controllability of stress of the nitride film is dramatically improved, thereby contributing to further development of the technique for forming a useful nitride film.

As described above, in the state where a desired nitride film is hardly obtained, the inventors tested and analyzed stress, a refractive index, and uniformity of a deposition rate of a nitride film formed under each of many film forming conditions, and obtained several interesting and correlative test results. Specifically, for example, it became clear that a nitride film has compressive stress when plasma is formed by applying high-frequency power having a relatively high frequency, whereas a nitride film has tensile stress when plasma is formed by applying high-frequency power having a relatively low frequency. Through further analyses, it became clear that the formed nitride film has not only desired stress but also a desired refractive index and uniformity of a deposition rate with high accuracy, simply by regulating the ratio between a period for applying high-frequency power having a relatively high frequency (hereinafter, also referred to as "first high-frequency power") and a period for applying high-frequency power having a relatively low frequency (hereinafter, also referred to as "second high-frequency power"). The first high-frequency power and the second high-frequency power are applied independently. The present invention has been devised in view of the standpoint and the fact mentioned above.

The present invention provides a nitride film manufacturing apparatus for forming a nitride film on a substrate provided in a chamber by a plasma CVD technique. More specifically, the nitride film manufacturing apparatus includes a controller for calculating a first period for applying first high-frequency power having a relatively high frequency and a second period for applying second high-frequency power having a relatively low frequency in order to obtain desired compressive stress or tensile stress (including a case where the stress is zero) of the nitride film, based on distribution of a refractive index of the nitride film and/or distribution of a deposition rate of the nitride film, the distribution falling within a predetermined numerical range and being obtained using the first high-frequency power and/or the second high-frequency power applied independently for forming the nitride film.

This manufacturing apparatus calculates the first period and the second period used for obtaining desired stress (including a case where the stress is zero) in the state where the condition allowing the distribution of the refractive index of the nitride film and/or the distribution of the deposition rate of the nitride film to fall within the predetermined numerical range is understood when forming the nitride film on the substrate using the first high-frequency power and/or the second high-frequency power to be applied independently. In other words, distribution of the refractive index of the nitride film and/or the deposition rate of the nitride film within the predetermined numerical range is reliably achieved when the so-called multilayer film is formed by independently applying the first high-frequency power and the second high-frequency power and the first period and the second period are arbitrarily calculated for obtaining desired stress, without being limited to applying only the first high-frequency power or only the second high-frequency power. Additionally, there is not provided either the first period or the second period when only one of the first high-frequency power and the second high-frequency power is applied in this manufacturing apparatus.

The manufacturing apparatus described above achieves not only the effect that the controller appropriately calculates the first period and the second period but also the significant effect that the distribution of the refractive index of the nitride film and/or the distribution of the deposition rate of the nitride film falls within the predetermined numerical range, only by setting the stress of the nitride film to be eventually achieved.

The present invention also provides a nitride film manufacturing method for forming a nitride film on a substrate provided in a chamber by a plasma CVD technique. More specifically, the nitride film manufacturing method includes the steps of: obtaining distribution of a refractive index of the nitride film and/or distribution of a deposition rate of the nitride film within a predetermined numerical range, using first high-frequency power having a relatively high frequency and/or second high-frequency power having a relatively low frequency, the first high-frequency power and the second high-frequency power being applied independently for forming the nitride film; and calculating a first period for applying the first high-frequency power and a second period for applying the second high-frequency power in order to obtain desired compressive stress or tensile stress (including a case where the stress is zero) of the nitride film, based on the distribution of the refractive index of the nitride film and/or the distribution of the deposition rate of the nitride film.

This manufacturing method includes calculation of the first period and the second period used for obtaining desired stress (including a case where the stress is zero) in the state where the condition allowing the distribution of the refractive index of the nitride film and/or the distribution of the deposition rate of the nitride film to fall within the predetermined numerical range is understood when forming the nitride film on the substrate using the first high-frequency power and/or the second high-frequency power to be applied independently. In other words, distribution of the refractive index of the nitride film and/or the deposition rate of the nitride film within the predetermined numerical range is reliably achieved when the so-called multilayer film is formed by independently applying the first high-frequency power and the second high-frequency power and the first period and the second period are arbitrarily calculated for obtaining desired stress, without being limited to applying only the first high-frequency power or only the second high-frequency power. Additionally, there is not provided either the first period or the second period when only one of the first high-frequency power and the second high-frequency power is applied in this manufacturing method.

The manufacturing method described above achieves not only the effect that the first period and the second period are appropriately calculated but also the significant effect that the distribution of the refractive index of the nitride film and/or the distribution of the deposition rate of the nitride film falls within the predetermined numerical range, only by setting the stress of the nitride film to be eventually achieved.

The present invention also provides a nitride film manufacturing program for forming a nitride film on a substrate provided in a chamber by a plasma CVD technique. More specifically, the nitride film manufacturing program includes commands for causing a computer to execute the steps of: obtaining distribution of a refractive index of the nitride film and/or distribution of a deposition rate of the nitride film within a predetermined numerical range, using first high-frequency power having a relatively high frequency and/or second high-frequency power having a relatively low frequency, the first high-frequency power and the second high-frequency power being applied independently for forming the nitride film; and calculating a first period for applying the first high-frequency power and a second period for applying the second high-frequency power in order to obtain desired compressive stress or tensile stress (including a case where the stress is zero) of the nitride film, based on the distribution of the refractive index of the nitride film and/or the distribution of the deposition rate of the nitride film.

This manufacturing program causes calculation of the first period and the second period used for obtaining desired stress (including a case where the stress is zero) in the state where the condition allowing the distribution of the refractive index of the nitride film and/or the distribution of the deposition rate of the nitride film to fall within the predetermined numerical range is understood when forming the nitride film on the substrate using the first high-frequency power and/or the second high-frequency power to be applied independently. In other words, distribution of the refractive index of the nitride film and/or the deposition rate of the nitride film within the predetermined numerical range is reliably achieved when the so-called multilayer film is formed by independently applying the first high-frequency power and the second high-frequency power and the first period and the second period are arbitrarily calculated for obtaining desired stress, without being limited to applying only the first high-frequency power or only the second high-frequency power. Additionally, there is not provided either the first period or the second period when only one of the first high-frequency power and the second high-frequency power is applied with this manufacturing program.

The manufacturing program described above achieves not only the effect that the first period and the second period are appropriately calculated but also the significant effect that the distribution of the refractive index of the nitride film and/or the distribution of the deposition rate of the nitride film falls within the predetermined numerical range, only by setting the stress of the nitride film to be eventually achieved.

The present application additionally discloses one exemplary nitride film manufacturing apparatus that includes a controller controlled by the manufacturing program.

In the present application, "tensile stress" in the manufacturing apparatus, the manufacturing method, and the manufacturing program means, as indicated in FIG. 1, stress in directions in which the film is contracted (arrows 91a in FIG. 1) in a state where a nitride film 90a is formed on a substrate 20. The substrate 20 is deformed with this stress by being curved in directions indicated by arrows 21a, although the degree of such deformation is varied depending on the material for the substrate 20 and the like. The stress in these directions is typically provided with a "+" (plus) value. Meanwhile, "compressive stress" in the manufacturing apparatus, the manufacturing method, and the manufacturing program means, as indicated in FIG. 2, stress in directions in which the film is expanded (arrows 91b in FIG. 2) in a state where a nitride film 90b is formed on the substrate 20. The substrate 20 is deformed with this stress by being curved in directions indicated by arrows 21b, although the degree of such deformation is varied depending on the material for the substrate 20 and the like. The stress in these directions is typically provided with a "−" (minus) value.

Furthermore, "desired compressive stress or tensile stress" in the manufacturing apparatus, the manufacturing method, and the manufacturing program also includes a case where the stress has a value not equal to zero. The stress described above is desirably eliminated (in other words, the stress is zero) in a nitride film having a single layer. When a multilayer film including the single nitride film and another film (e.g. an oxide film already having some stress) is formed, the multilayer film may be required to have no stress as a whole. In such a case, the single nitride film to be formed may be actually required to have tensile stress or compressive stress.

Effects of the Invention

A nitride film manufacturing apparatus according to the present invention achieves not only the effect that a controller appropriately calculates a first period and a second period but also the significant effect that distribution of a refractive index of the nitride film and/or distribution of a deposition rate of the nitride film falls within a predetermined numerical range, only by setting stress of the nitride film to be eventually achieved. Furthermore, a nitride film manufacturing method according to the present invention or a nitride film manufacturing program according to the present invention achieves not only the effect that a first period and a second period are appropriately calculated but also the significant effect that distribution of a refractive index of the nitride film and/or distribution of a deposition rate of the nitride film falls within a predetermined numerical range, only by setting stress of the nitride film to be eventually achieved.

DESCRIPTION OF REFERENCE SIGNS

Figure 1:
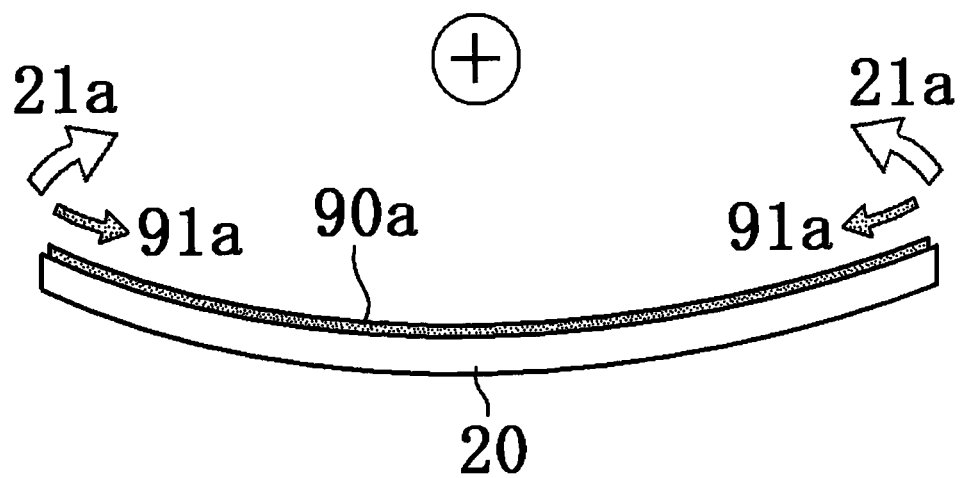
FIG. 1 is a conceptual diagram defining tensile stress in the present application.
Figure 2:
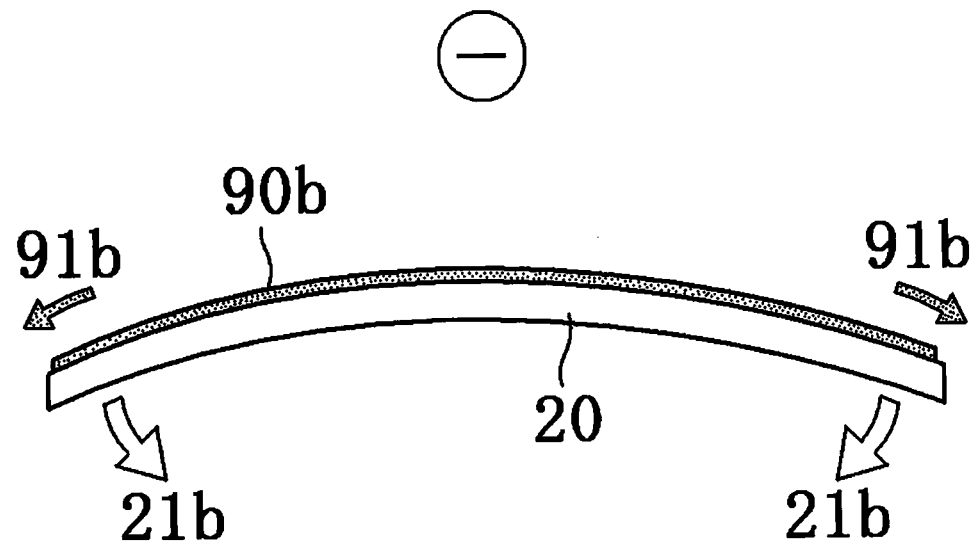
FIG. 2 is a conceptual diagram defining compressive stress in the present application.

20 Substrate
31 Stage
32a, 32b, 32c Gas cylinder
33a, 33b, 33c Gas flow rate regulator
30 Chamber
36a First high-frequency power source
36b Second high-frequency power source
37 Vacuum pump
38 Exhaust flow rate regulator
39 Controller
34a, 34b Heater
35 Shower head gas importer
40 Switch
70, 70a, 90a, 90b Nitride film
100 Nitride film manufacturing apparatus

EMBODIMENTS OF THE INVENTION

Embodiments of the present invention are described in detail as follows with reference to the accompanying drawings. In the entire drawings, common portions are denoted by common reference signs in this description. Elements according to the embodiments in the drawings are not necessarily illustrated on the same scales. Furthermore, flow rates of various types of gases to be mentioned below are indicated in a normal state.

First Embodiment

Figure 3:
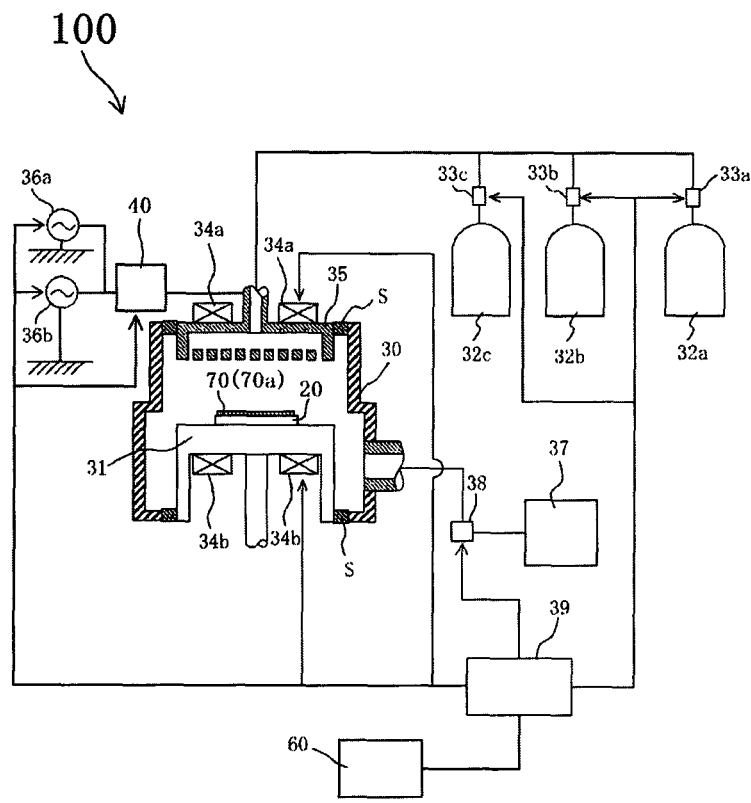
FIG. 3 is a partially sectional view showing a configuration of a nitride film manufacturing apparatus according to an embodiment of the present invention.

FIG. 3 is a partially sectional view showing a configuration of an apparatus 100 for manufacturing a nitride film (specifically, a silicon nitride film (SiN)) according to the present embodiment. This figure is schematically illustrated and thus includes no peripheral devices such as part of a known gas feed mechanism and part of a known exhaust mechanism.

As shown in FIG. 3, the nitride film manufacturing apparatus 100 according to the present embodiment is a parallel-plate plasma CVD apparatus, and roughly includes a chamber 30, a plurality of gas cylinders 32a, 32b, and 32c, and a controller 39 connected to a computer 60. Furthermore, a substrate (silicon substrate in the present embodiment) 20 conveyed by a known conveying mechanism (not shown) is placed on a stage 31 that is located near the center of the chamber 30. The substrate 20 and the inside of the chamber 30 are heated by heaters 34a and 34b that are installed on outer walls of the chamber 30. There are also provided a gas cylinder 32a for silane ($SiH_4$) gas, a gas cylinder 32b for ammonia ($NH_3$) gas, and a gas cylinder 32c for nitrogen ($N_2$) gas. The gas cylinders 32a to 32c are connected to the chamber 30 via gas flow rate regulators 33a to 33c, respectively. The present embodiment exemplifies the case of forming a silicon nitride film (SiN film) and thus no gas cylinder for oxygen ($O_2$) gas is illustrated. According to a different adoptable aspect, a gas cylinder for nitrous oxide ($N_2O$) gas is connected to the chamber 30 in addition to the above cylinders, in order to form a silicon oxynitride film (SiON film), for example.

The gases fed from the gas cylinder 32a for silane ($SiH_4$) gas, the gas cylinder 32b for ammonia ($NH_3$) gas, and the gas cylinder 32c for nitrogen ($N_2$) gas eventually pass through the same channel to reach the chamber 30. In the present embodiment, silane ($SiH_4$) gas and ammonia ($NH_3$) gas are so-called reactive gases, whereas nitrogen ($N_2$) gas is an unreactive gas. According to the categorization in the present application, nitrogen ($N_2$) gas belongs to the "unreactive gas", although part of nitrogen ($N_2$) gas possibly contributes to reaction. More specifically, nitrogen ($N_2$) gas is typically used for diluting a reactive gas or keeping an appropriate flow rate of the entire gasses imported into the chamber 30, while part of nitrogen ($N_2$) gas possibly contributes to reaction. Other unreactive gases include argon (Ar).

The nitride film manufacturing apparatus 100 according to the present embodiment further includes a first high-frequency power source 36a for applying high-frequency power of a relatively high frequency (13.56 MHz in the present embodiment), a second high-frequency power source 36b for applying high-frequency power of a relatively low frequency (380 kHz in the present embodiment), and a switch 40 for selecting one of the high-frequency power sources for applying high-frequency power. The first or second high-frequency power source 36a or 36b applies high-frequency power to a shower head gas importer 35 and generates plasma from the gas discharged from the shower head gas importer 35. The plasma thus generated reaches the substrate 20 on the stage 31, so that the substrate 20 is provided thereon with a silicon nitride film 70.

The shower head gas importer 35 is electrically insulated from the chamber 30 by a sealing member S having a ring shape. The stage 31 is also electrically insulated from the chamber 30 by the sealing member S having the ring shape. There is provided a vacuum pump 37 for depressurizing the chamber 30 and exhausting a gas generated after the processes. The vacuum pump 37 is connected to the chamber 30 via an exhaust flow rate regulator 38. The exhaust flow rate from the chamber 30 is changed by the exhaust flow rate regulator 38. The controller 39 controls the first high-frequency power source 36a, the second high-frequency power source 36b, the switch 40, the gas flow rate regulators 33a and 33b, a liquid flow rate regulator 33c, the heaters 34a and 34b, and the exhaust flow rate regulator 38.

Examples

Preliminary Tests

Processes of forming a nitride film in the chamber 30 are described next. In the present embodiment, the silicon nitride film 70 is formed on the substrate 20 in the chamber 30. Specifically, in exemplary processes, 5 to 50 sccm of silane ($SiH_4$) gas and 5 to 50 sccm of ammonia ($NH_3$) gas are fed into the chamber 30 until the chamber 30 has internal pressure of 50 to 200 Pa. In the present embodiment, 500 to 2000 sccm of nitrogen ($N_2$) gas is fed in addition to the two types of gases.

The heaters 34 are subsequently heated until the stage 31 has temperature of 150 to 350° C. Waiting time of at least 60 seconds is provided in order to stabilize the temperature of the substrate 20. Thereafter, the first high-frequency power source 36a or the second high-frequency power source 36b applies 30 to 400 W of first high-frequency power and/or 30 to 400 W of second high-frequency power to the shower head gas importer 35. In the present embodiment, the oxide film forming processes under the plasma conditions are executed for about 10 to 100 minutes. Under the processing conditions described above, the substrate 20 is provided thereon with the silicon nitride film 70 of about 0.1 to 1 μm thick.

Figure 4:
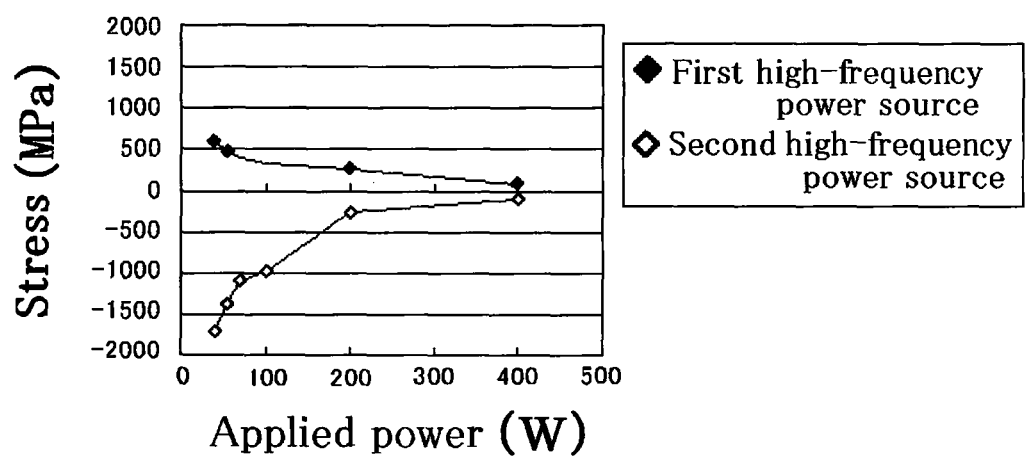
FIG. 4 is a graph indicating variation in stress of a silicon nitride film relative to variation in applied power in cases of applying only first high-frequency power and applying only second high-frequency power in the embodiment of the present invention.

FIG. 4 is a graph indicating variation in stress of the silicon nitride film 70 relative to variation in applied power in the cases of applying only the first high-frequency power and applying only the second high-frequency power in the present embodiment. The silane ($SiH_4$) gas had a flow rate of 5 sccm and the ammonia ($NH_3$) gas had a flow rate of 5 sccm. Furthermore, the nitrogen ($N_2$) gas had a flow rate of 2000 sccm, and the chamber had an internal pressure of 50 Pa. Moreover, the substrate had a temperature of 250° C.

As indicated in FIG. 4, it was found out very interestingly that the silicon nitride film 70 had stress in one direction in the case of applying only the first high-frequency power and had stress in the opposite direction in the case of applying only the second high-frequency power over the entire examined range.

Figure 5:
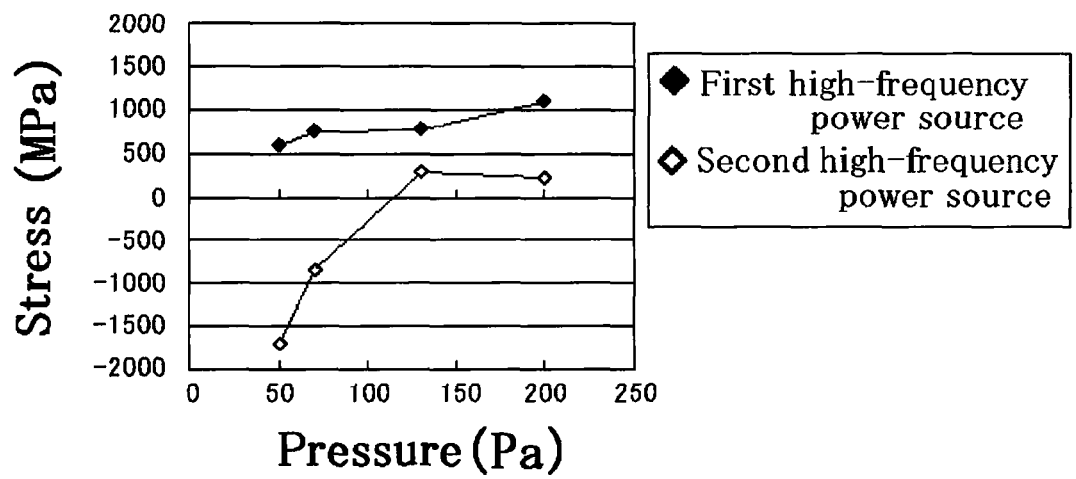
FIG. 5 is a graph indicating variation in stress of the silicon nitride film relative to variation in internal pressure of a chamber in the cases of applying only the first high-frequency power and applying only the second high-frequency power in the embodiment of the present invention.

FIG. 5 is a graph indicating variation in stress of the silicon nitride film 70 relative to variation in internal pressure of the chamber in the cases of applying only the first high-frequency power and applying only the second high-frequency power in the present embodiment. The silane ($SiH_4$) gas had a flow rate of 5 sccm and the ammonia ($NH_3$) gas had a flow rate of 5 sccm. Furthermore, the nitrogen ($N_2$) gas had a flow rate of 2000 sccm, and the substrate had a temperature of 250° C.

As indicated in FIG. 5, it was found out that the silicon nitride film 70 had stress in one direction in the case of applying only the first high-frequency power and had stress in the opposite direction in the case of applying only the second high-frequency power at least in the range having pressure of not more than 100 Pa. Furthermore, also in the range having pressure exceeding 100 Pa, it was verified that the stress in the former case is largely different from the stress in the latter case (even through the stress in each of the cases was in a same direction).

Figure 6:
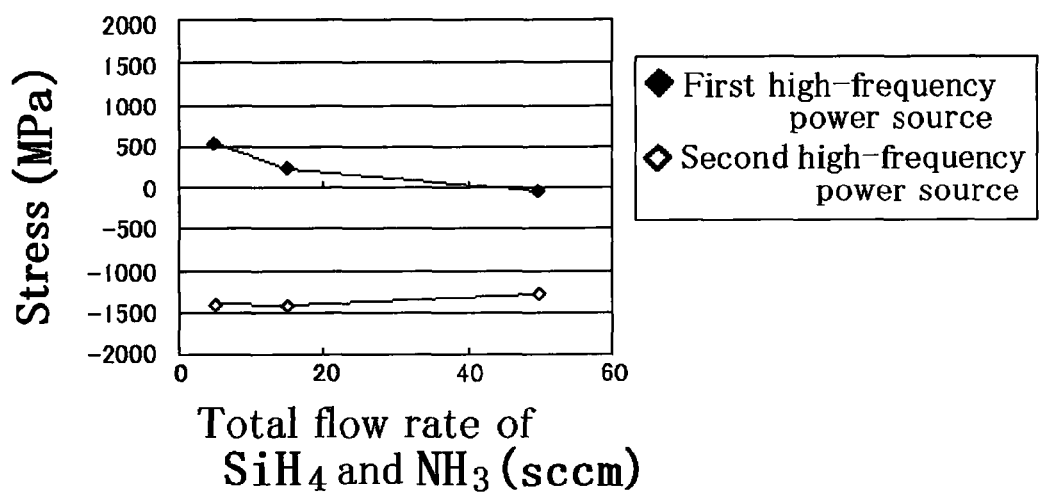
FIG. 6 is a graph indicating variation in stress of the silicon nitride film relative to variation in total flow rate in the cases of applying only the first high-frequency power and applying only the second high-frequency power in the embodiment of the present invention, assuming that two types of reactive gases (silane ($SiH_4$) gas and ammonia ($NH_3$) gas) imported into the chamber have a flow ratio of 1:1.

FIG. 6 is a graph indicating variation in stress of the silicon nitride film 70 relative to variation in total flow rate in the case of applying only the first high-frequency power in the present embodiment, assuming that the two types of reactive gases (silane ($SiH_4$) gas and ammonia ($NH_3$) gas) imported into the chamber have a flow ratio of 1:1. The nitrogen ($N_2$) gas had a flow rate of 2000 sccm, and the chamber had an internal pressure of 50 Pa. Moreover, the substrate had a temperature of 250° C.

As indicated in FIG. 6, it was found out that the silicon nitride film 70 had stress in one direction in the case of applying only the first high-frequency power and had stress in the opposite direction in the case of applying only the second high-frequency power at least in the range having a total flow rate of not more than 40 sccm. Furthermore, also in the range having a total flow rate exceeding 40 sccm, it was verified that the stress in the former case is largely different from the stress in the latter case (even though the stress in each of the cases was in a same direction).

Figure 7:
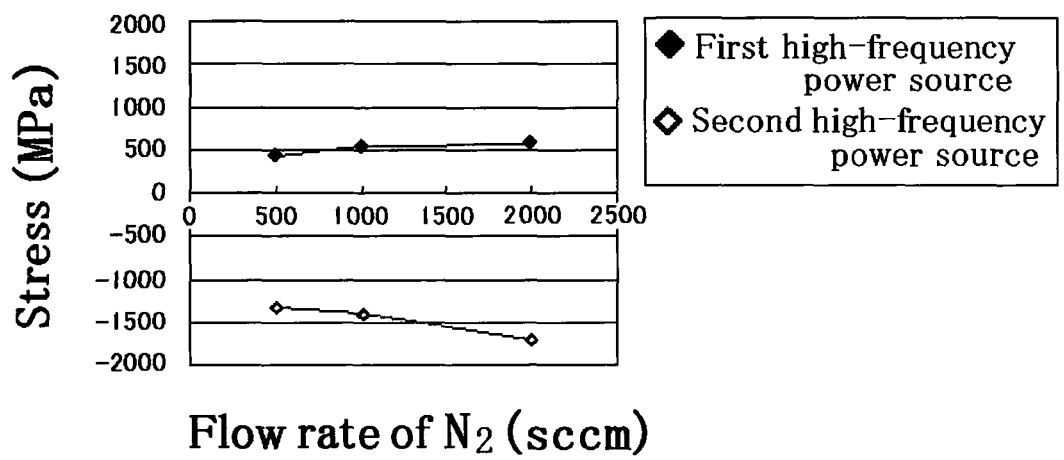
FIG. 7 is a graph indicating variation in stress of the silicon nitride film relative to variation in flow rate of an unreactive gas (nitrogen ($N_2$) gas) imported into the chamber in the cases of applying only the first high-frequency power and applying only the second high-frequency power in the embodiment of the present invention.

FIG. 7 is a graph indicating variation in stress of the silicon nitride film 70 relative to variation in flow rate of the unreactive gas (nitrogen ($N_2$) gas) imported into the chamber in the case of applying only the first high-frequency power in the present embodiment. The silane ($SiH_4$) gas had a flow rate of 5 sccm and the ammonia ($NH_3$) gas had a flow rate of 5 sccm. Furthermore, the chamber had an internal pressure of 50 Pa, and the substrate had a temperature of 250° C.

As indicated in FIG. 7, it was found out that, the silicon nitride film 70 had stress in one direction in the case of applying only the first high-frequency power and had stress in the opposite direction in the case of applying only the second high-frequency power over the entire examined range.

Figure 8:
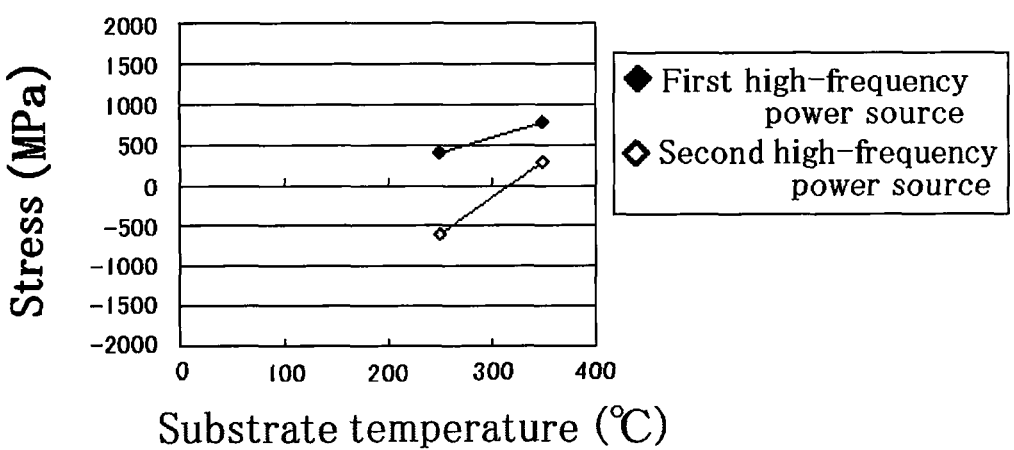
FIG. 8 is a graph indicating variation in stress of the silicon nitride film relative to variation in temperature of a substrate in the cases of applying only the first high-frequency power and applying only the second high-frequency power in the embodiment of the present invention.

FIG. 8 is a graph indicating variation in stress of the silicon nitride film 70 relative to variation in temperature of the substrate in the cases of applying only the first high-frequency power and applying only the second high-frequency power in the present embodiment. In this case, the silane ($SiH_4$) gas had a flow rate of 5 sccm and the ammonia ($NH_3$) gas had a flow rate of 5 sccm. Furthermore, the nitrogen ($N_2$) gas had a flow rate of 2000 sccm, and the chamber had an internal pressure of 50 Pa.

As indicated in FIG. 8, it was verified that the silicon nitride film 70 had stress in one direction in the case of applying only the first high-frequency power and had stress in the opposite direction in the case of applying only the second high-frequency power at least in the range having substrate temperature of not more than 300° C. Furthermore, also in the range having substrate temperature exceeding 300° C., it was verified that the stress in the former case is largely different from the stress in the latter case (even though the stress in each of the cases was in a same direction).

Furthermore, in the present embodiment, the silicon nitride film 70 had a refractive index of about 1.8 to 2.2 in the case of applying only the first high-frequency power. The film had an averaged deposition rate of about 10 to 50 nm/min., and the film had ununiformity of a deposition rate of ±1 to ±10%. Meanwhile, the silicon nitride film 70 had a refractive index of about 1.7 to 2 in the case of applying only the second high-frequency power. The film had an averaged deposition rate of about 10 to 50 nm/min., and the film had ununiformity of a deposition rate of at most ±5%, more particularly from ±1 to ±5%.

Example 1

In view of these various interesting results, the inventors then manufactured a silicon nitride film 70*a* by so-called laminating, on the substrate 20, a silicon nitride film formed by applying only the first high-frequency power and a silicon nitride film formed by applying only the second high-frequency power, using the nitride film manufacturing apparatus 100 according to the present embodiment. The inventors examined dependency among the stress of the nitride film, the refractive index of the nitride film, and the deposition rate of the nitride film, in a case of changing the ratio between the processing periods for the first high-frequency power and the second high-frequency power. Hereinafter, the period of application of the first high-frequency power is referred to as a "first period", whereas the period of application of the second high-frequency power is referred to as a "second period".

Figure 9:
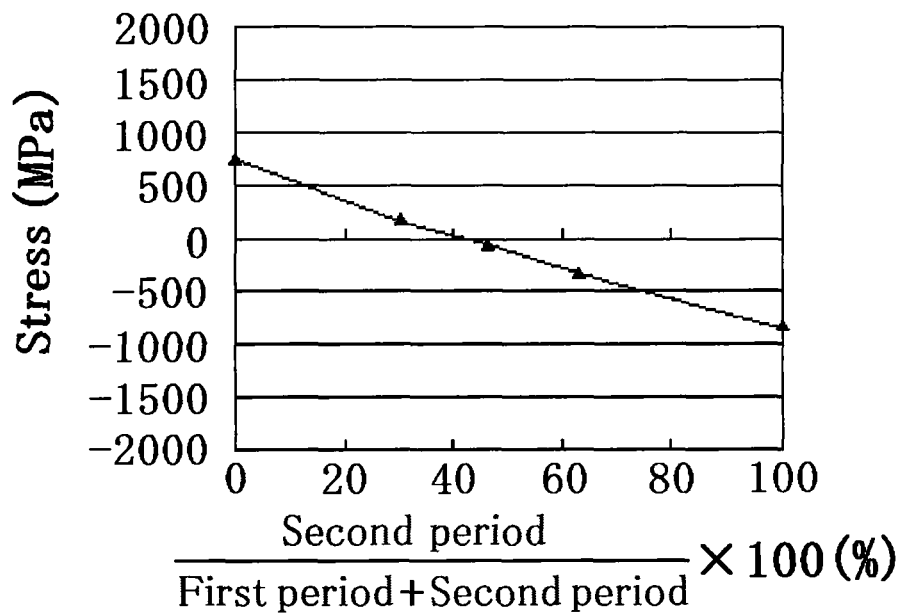
FIG. 9 is a graph indicating variation in stress in a case of changing a ratio between a first period and a second period in the embodiment of the present invention.

FIG. 9 is a graph indicating variation in stress in the case of changing the ratio between the first period and the second period. As indicated in FIG. 9, it was found out that the stress is varied substantially linearly from tensile stress (+) to compressive stress (−) as the ratio for the second period increases. This indicates that, by changing the ratio between the first period and the second period, it is possible to obtain any desired stress from a numerical value of the stress obtained in the case of applying only the first high-frequency power to a numerical value of the stress obtained in the case of applying only the second high-frequency power.

Further examination on the correlation of the ratio between the first period and the second period with physical properties of the silicon nitride film 70*a* led to more interesting finding. The details thereof are described below.

Figure 10:
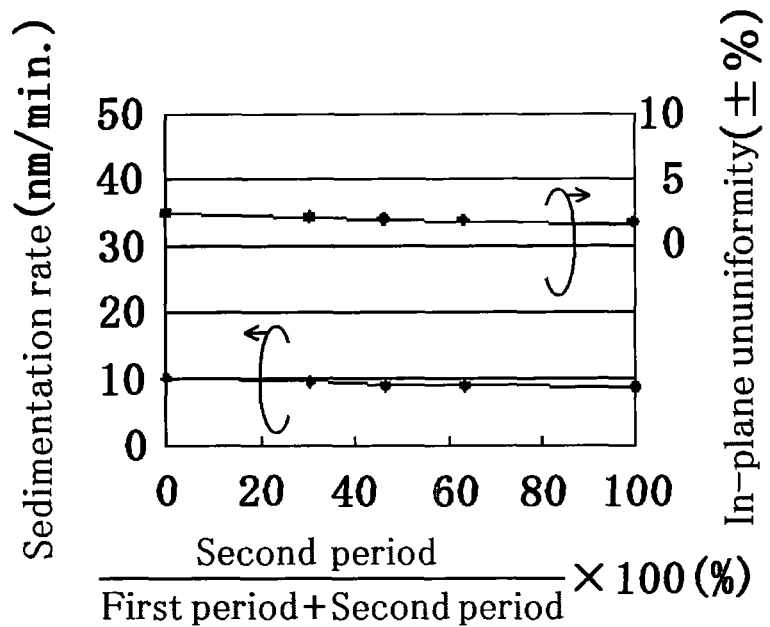
FIG. 10 is a graph indicating variation in deposition rate and variation in in-plane uniformity (i.e. in-plane ununiformity) in the case of changing the ratio between the first period and the second period in the embodiment of the present invention.
Figure 11:
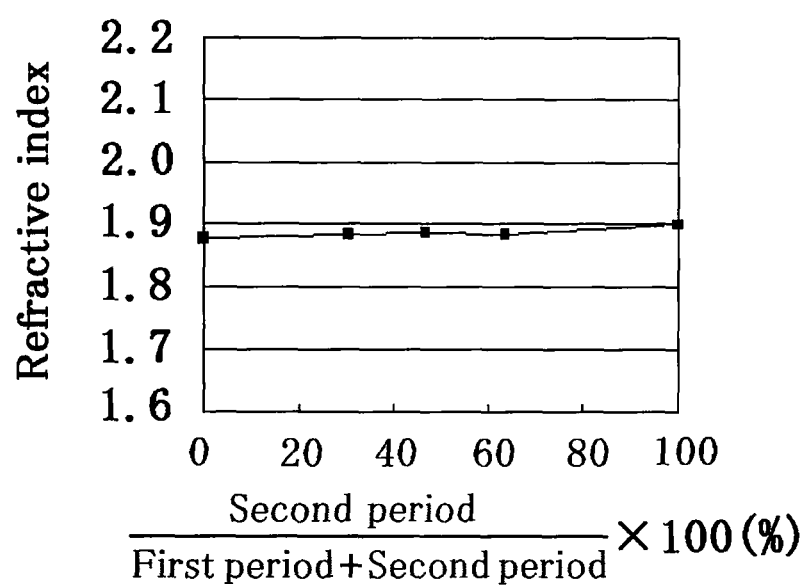
FIG. 11 is a graph indicating variation in refractive index in the case of changing the ratio between the first period and the second period in the embodiment of the present invention.

FIG. 10 indicates variation in averaged deposition rate and variation in in-plane ununiformity (i.e. dispersion in deposition rate) in the case of changing the ratio between the first period and the second period in the present embodiment. FIG. 11 is a graph indicating variation in refractive index of the silicon nitride film 70*a* in the case of changing the ratio between the first period and the second period in the present embodiment.

As indicated in FIGS. 10 and 11, it was verified that the deposition rate, the in-plane ununiformity, and the refractive index each have a substantially constant value independently of the ratio between the first period and the second period. By combining the results indicated in FIGS. 10 and 11 with the result indicated in FIG. 9, it is possible to obtain distribution of the refractive index of the nitride film within a predetermined numerical range and/or the deposition rate of the nitride film, even when arbitrarily deriving the first period and the second period in order to obtain desired stress.

Having achieved the outcome described above, the controller 39 of the nitride film manufacturing apparatus 100 according to the present embodiment has the function of calculating the first period and the second period for obtaining desired compressive stress or tensile stress (including a case where the stress is zero) of the silicon nitride film 70*a*, on the basis of distribution of the refractive index of the silicon nitride film 70*a* and/or distribution of the deposition rate (more particularly, in-plane distribution of the substrate of the deposition rate) of the silicon nitride film 70*a*, which is within a predetermined numerical range and is obtained by independently applying the first high-frequency power and/or the second high-frequency power. More specifically, the controller 39, which stores, for example, data corresponding to FIGS. 9 to 11 obtained from various data on the various preliminary tests, calculates the first period and the second period so that the eventually formed nitride film has the desired stress, upon receipt of a value of film stress required in the processes of manufacturing the nitride film. The controller 39 according to the present embodiment controls the first high-frequency power source 36*a*, the second high-frequency power source 36*b*, the switch 40, the gas flow rate regulators 33*a* and 33*b*, and/or the like, so as to manufacture, on the substrate 20, the silicon nitride film 70*a* that has desired stress as well as a refractive index and/or a deposition rate within a desired range.

As already mentioned, the controller 39 is connected to the computer 60. The computer 60 monitors or totally controls the respective processes in accordance with a nitride film manufacturing program for the execution of the respective processes. Needless to particularly mention, the controller 39 has a recorder and a calculator (not shown) for calculating the first period and the second period. The nitride film manufacturing program is described below with reference to the specific manufacture flowchart. In the present embodiment, the manufacturing program is stored in a hard disk drive in the computer 60 or a known recording medium such as an optical disk inserted in an optical disk drive or the like provided to the computer 60. The storage location for this manufacturing program is not limited to the above. For example, this manufacturing program can be partially or entirely stored in the controller 39 according to the present embodiment. This manufacturing program is also capable of monitoring or controlling the respective processes by means of a local area network, interne connection, or the like according to a known technique. According to a different adoptable aspect, instead of the controller 39, the computer 60 can include the recorder and the calculator (not shown) for calculating the first period and the second period.

Figure 12:
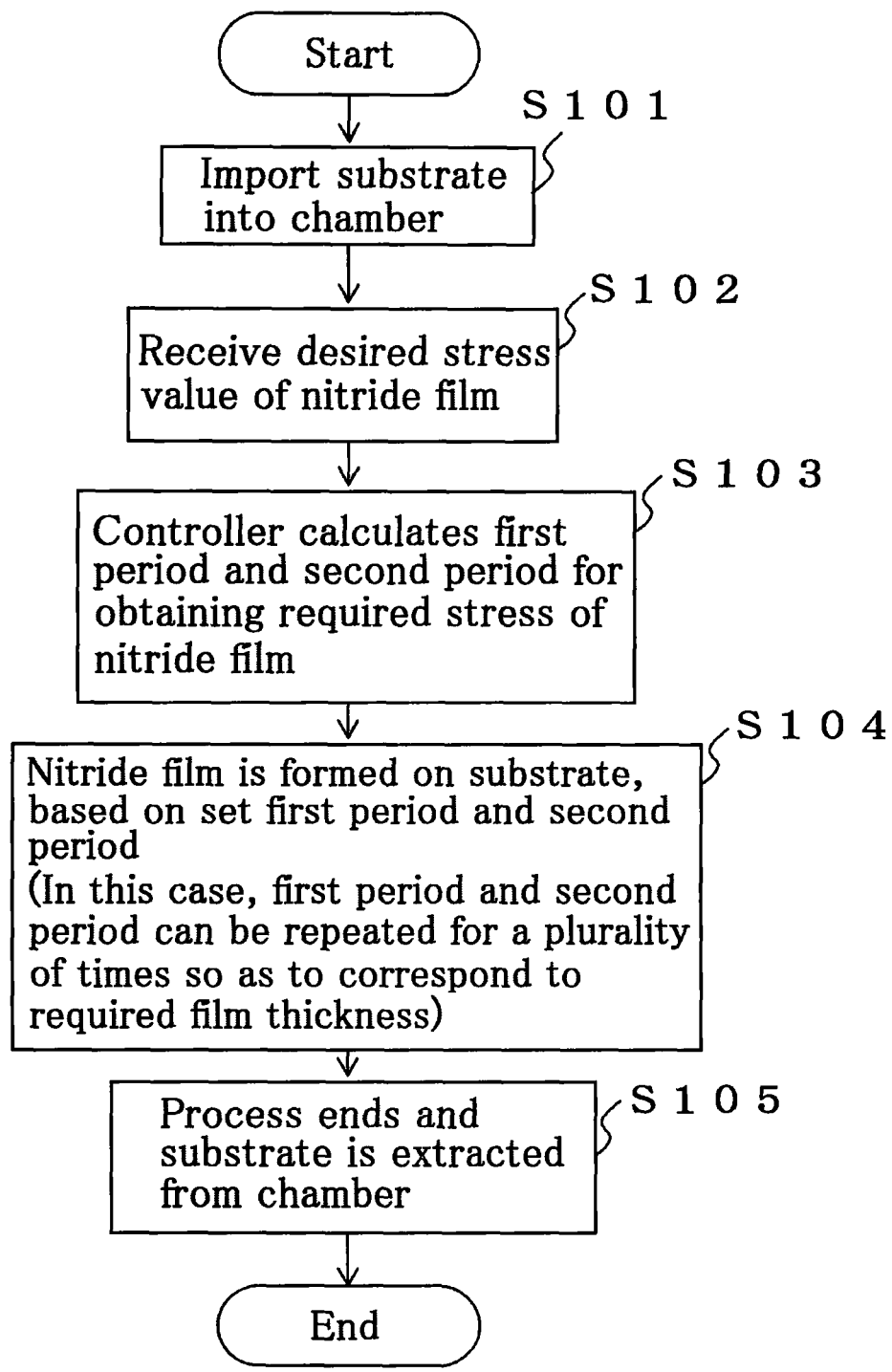
FIG. 12 is a flowchart of manufacture of a nitride film in the embodiment of the present invention.

Initially described is the nitride film manufacturing program according to the present embodiment. FIG. 12 is a flowchart of manufacture of a nitride film according to the present embodiment.

As shown in FIG. 12, initially in step S101, the substrate 20 is inserted into the chamber 20. Subsequently executed are the processes that are typically executed in a plasma CVD apparatus, such as exhaust until obtaining predetermined pressure, heating the stage 31, and waiting. Then received in step S102 is a value of stress of the nitride film to be eventually achieved. According to the present embodiment, in step S103, the controller 39, which stores the data corresponding to FIGS. 9 to 11 obtained from the various data on the various preliminary tests, calculates the first period and the second period so as to obtain the value of the stress required in step S102.

Thereafter in step S104, on the basis of the first period and the second period calculated, in other words, set by the controller 39, the controller 39 controls the first high-frequency power source 36a, the second high-frequency power source 36b, the switch 40, the gas flow rate regulators 33a and 33b, and/or the like, to form a nitride film on the substrate 20. In a case of forming a thick film that cannot be obtained by going through each of the first period and the second period once, the first period and the second period are repeated for a plurality of times.

Lastly in step S105, the substrate 20 is extracted from the chamber 30 after the completion of the processes. As described above, the processes in steps S101 to S106 are executed to obtain the nitride film that has desired stress as well as a refractive index and/or a deposition rate within a desired range.

Other Embodiments

The above embodiment exemplifies the apparatus, the method, and the program for manufacturing mainly a silicon nitride film. The embodiment described above is applicable to an oxynitride film (e.g. silicon oxynitride film). Similarly to the nitride film in the narrower sense, a formed oxynitride film typically has compressive stress or tensile stress. It is quite difficult to control the stress as well as distribution of the refractive index and distribution of the deposition rate. However, when the above embodiment is applied to the oxynitride film, an effect equivalent to that of the above embodiment or at least part of its effect can be achieved.

Figure 13:
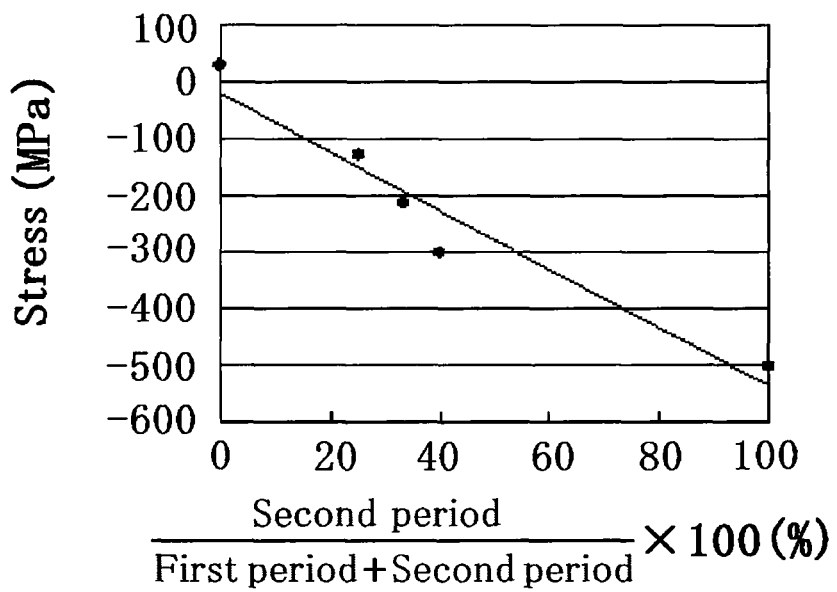
FIG. 13 is a graph indicating variation in stress in a case of changing a ratio between a first period and a second period in another embodiment of the present invention.

For example, FIG. 13 is a graph corresponding to FIG. 9, indicating variation in stress in the case of changing the ratio between the first period and the second period for the silicon oxynitride film. It is verified from FIG. 13 that, also in the case of manufacturing the silicon oxynitride film, stress is decreased substantially linearly from 0% to 100% on the transverse axis.

Figure 14:
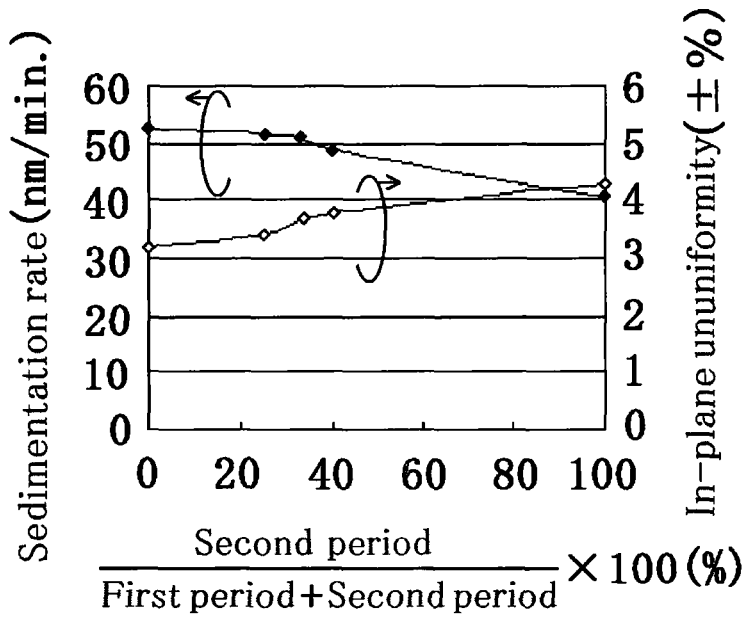
FIG. 14 is a graph indicating variation in deposition rate and variation in in-plane uniformity (i.e. in-plane ununiformity) in the case of changing the ratio between the first period and the second period in the other embodiment of the present invention.
Figure 15:
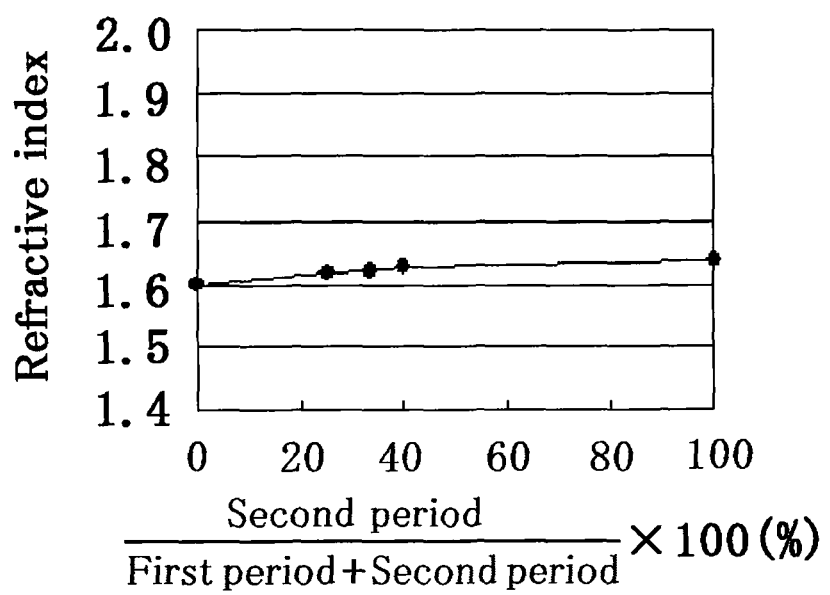
FIG. 15 is a graph indicating variation in refractive index in the case of changing the ratio between the first period and the second period in the other embodiment of the present invention.

FIG. 14 corresponds to FIG. 10 and indicates variation in averaged deposition rate and variation in in-plane ununiformity (i.e. dispersion in deposition rate) in the case of changing the ratio between the first period and the second period for the silicon oxynitride film. FIG. 15 is a graph corresponding to FIG. 11, indicating variation in refractive index of the silicon oxynitride film in the case of changing the ratio between the first period and the second period for the silicon oxynitride film.

As indicated in FIGS. 13 to 15, similarly to the silicon nitride film, it is possible to control stress of the silicon oxynitride film as well as control distribution of the refractive index and distribution of the deposition rate of the silicon oxynitride film. As described above, the above embodiment is thus applicable to the silicon oxynitride film.

The example 1 exemplifies the silicon nitride film 70a that is obtained by laminating the single silicon nitride film formed by applying only the first high-frequency power and the single silicon nitride film formed by applying only the second high-frequency power. The silicon nitride film 70a according to this example is not limited to the above. As already described, according to a different adoptable aspect, the first period for applying only the first high-frequency power and the second period for applying only the second high-frequency power are provided alternately for a plurality of times. When the first period and the second period are repeated for a plurality of times, the eventually formed silicon nitride film has entirely homogenized physical properties. Such an aspect is rather preferred. Furthermore, assume that the first period and the second period, which are relatively short, are repeated alternately for a plurality of times to laminate a large number of thin films. In this case, if the film thus obtained is subject to etching, etching is likely to be effectively executed with constancy in terms of its etching rate or the like.

Furthermore, in each of the embodiments described above, the controller 39 is connected directly to the exhaust flow rate regulator 38 and the like. However, none of the aspects according to the above embodiments is limited to such a configuration. For example, other adoptable aspects of the above embodiments can include an aspect in which the controller 39 is connected to the exhaust flow rate regulator 38 and the like by way of a local area network, Internet connection, or the like according to a known technique, in other words, indirectly. The "controller" in the present application also includes the controller 39 according to an aspect, which causes a calculator provided separately from the controller 39 to execute the function of calculating the first period and the second period. According to a different adoptable aspect, the calculator is connected directly or indirectly to the nitride film manufacturing apparatus 100 as described above. According to each of the embodiments described above, the controller 39 typically calculates the first period and the second period. Such calculation itself is not limited either. For example, the above manufacturing processes can include manufacture of a silicon nitride film according to an aspect in which the controller 39 or the computer 60 receives and stores the first period and the second period calculated by a manager, an operator, or the like of the silicon nitride film manufacturing apparatus 100 on the basis of the preliminary tests.

Moreover, the above embodiments adopt a parallel-plate plasma generator (capacitive-coupled plasma; CCP). The present invention is not limited to this case. The effects of the present invention are exerted also in a case of adopting different high-density plasma such as inductively-coupled plasma (ICP) or electron-cyclotron resonance plasma (ECR).

Each of the above embodiments has been disclosed not for limiting the present invention but for describing the corresponding embodiment. Furthermore, modifications made within the scope of the present invention, inclusive of other combinations of the respective embodiments, will be also included in the scope of the patent claims.

The invention claimed is:

1. A nitride film manufacturing apparatus for forming a nitride film on a substrate provided in a chamber by a plasma CVD technique, the apparatus comprising:
a controller for calculating a first period for applying first high-frequency power having a relatively high frequency and a second period for applying second high-frequency power having a relatively low frequency in order to obtain desired compressive stress or tensile stress of the nitride film, based on distribution of a refractive index of the nitride film and/or distribution of a deposition rate of the nitride film, the distribution falling within a predetermined numerical range and being obtained using the first high-frequency power and/or the second high-frequency power applied independently for forming the nitride film.

2. The nitride film manufacturing apparatus according to claim 1, wherein
the controller alternately applies the first period and the second period.

3. The nitride film manufacturing apparatus according to claim 1, wherein, in the predetermined numerical range, the distribution of the refractive index of the nitride film and/or the distribution of the deposition rate of the nitride film has ununiformity of at most ±5%.

4. The nitride film manufacturing apparatus according to claim 2, wherein, in the predetermined numerical range, the distribution of the refractive index of the nitride film and/or the distribution of the deposition rate of the nitride film has ununiformity of at most ±5%.

5. The nitride film manufacturing apparatus according to claim 1, wherein
the distribution of the refractive index of the nitride film and/or the distribution of the deposition rate of the nitride film within the predetermined numerical range is obtained by changing at least one value selected from a group consisting of temperature of the substrate, internal pressure of the chamber, a flow rate of a reactive gas imported into the chamber, and a flow rate of an unreactive gas imported into the chamber.

6. The nitride film manufacturing apparatus according to claim 2, wherein
the distribution of the refractive index of the nitride film and/or the distribution of the deposition rate of the nitride film within the predetermined numerical range is obtained by changing at least one value selected from a group consisting of temperature of the substrate, internal pressure of the chamber, a flow rate of a reactive gas imported into the chamber, and a flow rate of an unreactive gas imported into the chamber.

7. A nitride film manufacturing method for forming a nitride film on a substrate provided in a chamber by a plasma CVD technique, the method comprising the steps of:
obtaining distribution of a refractive index of the nitride film and/or distribution of a deposition rate of the nitride film within a predetermined numerical range, using first high-frequency power having a relatively high frequency and/or second high-frequency power having a relatively low frequency, the first high-frequency power and the second high-frequency power being applied independently for forming the nitride film; and
calculating a first period for applying the first high-frequency power and a second period for applying the second high-frequency power in order to obtain desired compressive stress or tensile stress of the nitride film, based on the distribution of the refractive index of the nitride film and/or the distribution of the deposition rate of the nitride film.

8. The nitride film manufacturing method according to claim 7, wherein
the first period and the second period are provided alternately.

9. The nitride film manufacturing method according to claim 7, wherein, in the predetermined numerical range, the distribution of the refractive index of the nitride film and/or the distribution of the deposition rate of the nitride film has ununiformity of at most ±5%.

10. The nitride film manufacturing method according to claim 8, wherein, in the predetermined numerical range, the distribution of the refractive index of the nitride film and/or the distribution of the deposition rate of the nitride film has ununiformity of at most ±5%.

11. A nitride film manufacturing program for forming a nitride film on a substrate provided in a chamber by a plasma CVD technique, the program comprising commands for causing a computer to execute the steps of:
obtaining distribution of a refractive index of the nitride film and/or distribution of a deposition rate of the nitride film within a predetermined numerical range, using first high-frequency power having a relatively high frequency and/or second high-frequency power having a relatively low frequency, the first high-frequency power and the second high-frequency power being applied independently for forming the nitride film; and
calculating a first period for applying the first high-frequency power and a second period for applying the second high-frequency power in order to obtain desired compressive stress or tensile stress of the nitride film, based on the distribution of the refractive index of the nitride film and/or the distribution of the deposition rate of the nitride film.

* * * * *